United States Patent
Shi et al.

(10) Patent No.: US 9,819,189 B2
(45) Date of Patent: Nov. 14, 2017

(54) AREA AND POWER EFFICIENT SWITCHABLE SUPPLY NETWORK FOR POWERING MULTIPLE DIGITAL ISLANDS

(71) Applicant: QUALCOMM Incorporated, San Diego, CA (US)

(72) Inventors: Chunlei Shi, San Diego, CA (US); Yu Pu, San Diego, CA (US); Kenneth David Easton, San Diego, CA (US); Kendrick Hoy Leong Yuen, San Diego, CA (US); Giby Samson, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 194 days.

(21) Appl. No.: 14/843,983

(22) Filed: Sep. 2, 2015

(65) Prior Publication Data

US 2017/0063092 A1 Mar. 2, 2017

(51) Int. Cl.
*G06F 1/32* (2006.01)
*H02J 3/38* (2006.01)
*H03K 19/00* (2006.01)

(52) U.S. Cl.
CPC .............. *H02J 3/38* (2013.01); *G06F 1/3287* (2013.01); *H02J 2003/388* (2013.01); *H03K 19/0016* (2013.01)

(58) Field of Classification Search
CPC .................................. G06F 1/32; G06F 1/3234
See application file for complete search history.

(56) References Cited

U.S. PATENT DOCUMENTS

| 6,127,815 | A | 10/2000 | Wilcox |
| 7,454,642 | B2 * | 11/2008 | Bernstein .............. G06F 1/3203 713/320 |
| 7,737,740 | B2 * | 6/2010 | Millar .................... H03K 5/135 327/141 |
| 8,026,636 | B2 | 9/2011 | Oh |
| 8,599,597 | B2 | 12/2013 | Terzioglu et al. |

(Continued)

FOREIGN PATENT DOCUMENTS

FR 2397091 A1 2/1979

OTHER PUBLICATIONS

International Search Report and Written Opinion—PCT/US2016/044451—ISA/EPO—Nov. 8, 2016.

*Primary Examiner* — Jeffrey Zweizig
(74) *Attorney, Agent, or Firm* — MG-IP Law, P.C.

(57) ABSTRACT

A switchable supply network for powering multiple digital islands. In one embodiment, a first digital island includes a first power collapsible circuit and a first retention circuit, and a second digital island includes a second power collapsible circuit and a second retention circuit. In a normal mode of operation, the first digital island is provided a first supply voltage and a second digital island is provided a second supply voltage higher than the first supply voltage. In a transition mode the second power collapsible circuit is powered down and the second supply voltage is lowered and provided to the second retention circuit. When the second supply voltage falls below the first supply voltage, the first power collapsible circuit is powered down. The second supply voltage is now provided only to the retention circuits, and is furthered lowered in a retention mode to a final retention voltage.

20 Claims, 6 Drawing Sheets

(56) References Cited

U.S. PATENT DOCUMENTS

| | | |
|---|---|---|
| 8,837,226 B2 | 9/2014 | McCombs et al. |
| 9,104,395 B2 * | 8/2015 | Miyake .................... G06F 1/26 |
| 9,559,693 B2 * | 1/2017 | Ishii ................... H03K 19/0016 |
| 2008/0307240 A1 | 12/2008 | Dahan et al. |
| 2011/0216619 A1 | 9/2011 | Mair et al. |
| 2014/0167813 A1 | 6/2014 | Raychowdhury et al. |

\* cited by examiner

| (Normal Mode) Table 1 | |
|---|---|
| S1 | ON |
| S2 | ON |
| S3 | ON |
| S4 | ON |
| S5 | OFF |
| S6 | OFF |

| (Transition Mode) Table 2 | |
|---|---|
| S1 | ON |
| S2 | ON |
| S3 | OFF |
| S4 | OFF |
| S5 | ON |
| S6 | OFF |

| (Retention Mode) Table 3 | |
|---|---|
| S1 | OFF |
| S2 | OFF |
| S3 | OFF |
| S4 | OFF |
| S5 | ON |
| S6 | ON |

Controller — 134

FIG. 3

AREA AND POWER EFFICIENT SWITCHABLE SUPPLY NETWORK FOR POWERING MULTIPLE DIGITAL ISLANDS

FIELD OF DISCLOSURE

The disclosure is in the art of electronic circuits, and more particularly to circuits for powering multiple digital islands with a normal mode of operation and a retention mode of operation.

BACKGROUND

Low power digital circuits are essential building blocks for wearable or Internet-of-Things circuits. For such applications, a low power digital circuit typically comprises two parts: a power collapsible part and a retention part. During a retention mode, the supply voltage provided to the power collapsible part is collapsed to 0V whereas the supply voltage to the retention part is kept on to maintain state. It is desirable to provide power supply voltages to both the power collapsible part and the retention part in a manner that is both area and power efficient.

SUMMARY

Embodiments of the invention are directed to systems and method for an area and power efficient switchable supply network for powering multiple digital islands.

In an embodiment, a method comprises: coupling an output port of a first voltage regulator to a first power collapsible circuit and a first retention circuit to provide a first supply voltage; coupling an output port of a second voltage regulator to a second power collapsible circuit and a second retention circuit to provide a second supply voltage greater than the first supply voltage; de-coupling the output port of the second voltage regulator from the second power collapsible circuit; coupling the output port of the second voltage regulator to the second retention circuit to provide a supply voltage; lowering the supply voltage; and comparing the first supply voltage to the supply voltage as the supply voltage is lowered.

In an embodiment, a circuit comprises: a first voltage regulator to provide a first supply voltage; a second voltage regulator to provide a second supply voltage and a supply voltage, the second supply voltage greater than the first supply voltage; a first power collapsible circuit; a first retention circuit; a second power collapsible circuit; a second retention circuit; a comparator; and a controller coupled to the first voltage regulator, the second voltage regulator, and the comparator, the controller to: during a normal mode, couple the first voltage regulator to the first power collapsible circuit and the first retention circuit to provide the first supply voltage, and couple the second voltage regulator to the second power collapsible circuit and the second retention circuit to provide the second supply voltage; and during a transition mode, de-couple the second voltage regulator from the second power collapsible circuit, couple the second voltage regulator to the second retention circuit to provide the supply voltage and to lower the supply voltage, and configure the comparator to compare the first supply voltage to the supply voltage as the supply voltage is lowered.

In an embodiment, a circuit comprises: a first voltage regulator having an output port; a first power collapsible circuit; a first retention circuit; a second voltage regulator having an output port; a second power collapsible circuit; a second retention circuit; means for coupling the output port of the first voltage regulator to the first power collapsible circuit and the first retention circuit to provide a first supply voltage; means for coupling the output port of the second voltage regulator to the second power collapsible circuit and the second retention circuit to provide a second supply voltage greater than the first supply voltage; means for de-coupling the output port of the second voltage regulator from the second power collapsible circuit; means for coupling the output port of the second voltage regulator to the second retention circuit to provide a supply voltage; means for lowering the supply voltage; and means for comparing the first supply voltage to the supply voltage as the supply voltage is lowered.

BRIEF DESCRIPTION OF THE DRAWINGS

The accompanying drawings are presented to aid in the description of embodiments of the invention and are provided solely for illustration of the embodiments and not limitation thereof.

FIG. 3 illustrates the states of switches in the embodiment of FIG. 1.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
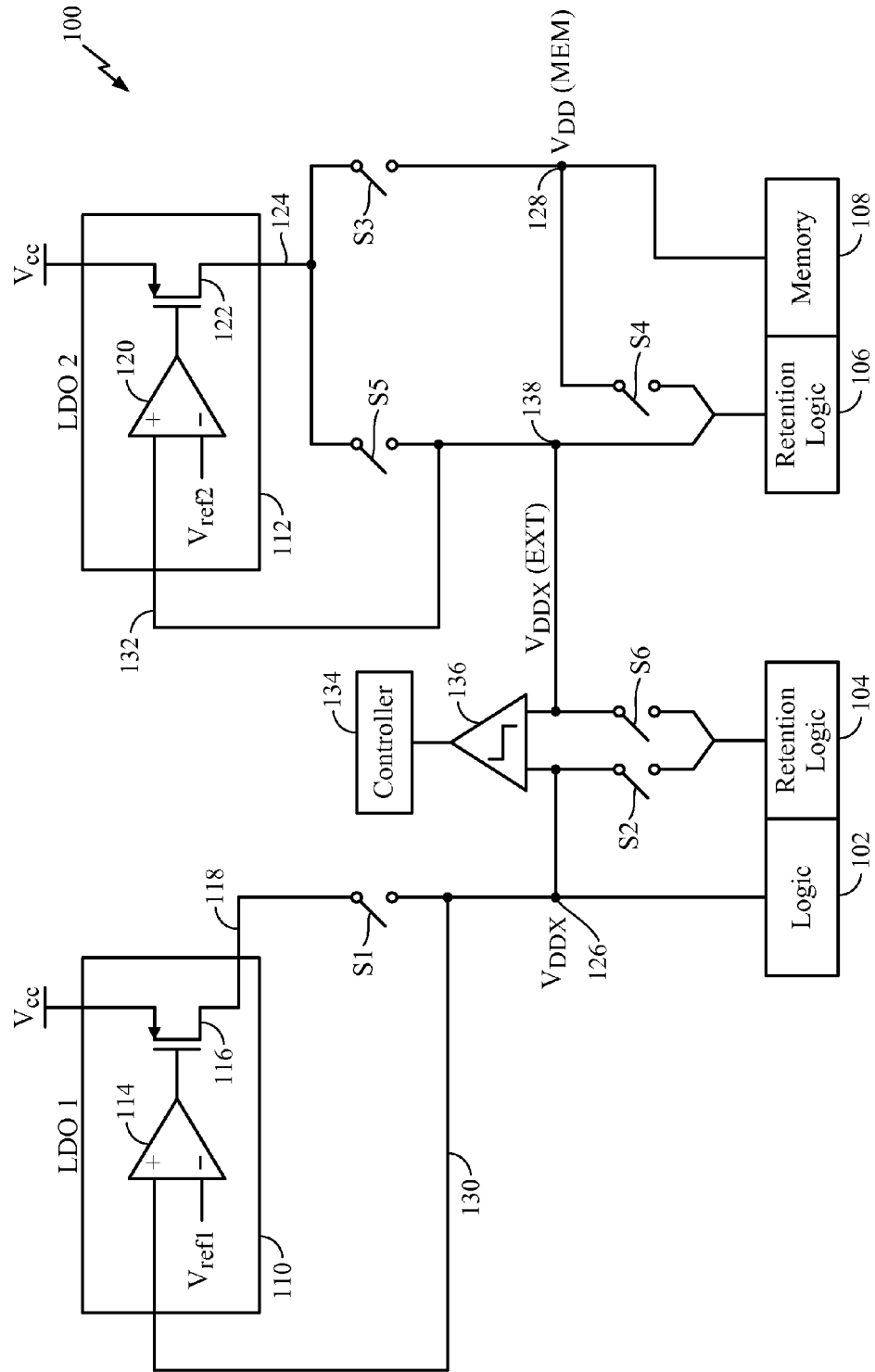
FIG. 1 is a circuit according to an embodiment.

FIG. 1 illustrates the system 100 according to an embodiment. The circuits 102 and 104 when in a normal mode operate in a first voltage domain, and the circuits 106 and 108 when in the normal mode operate in a second voltage domain. Here, the use of the adjective normal is used for convenience to refer to the case in which the circuits are operating in a fully active state with their nominal supply voltage. In the particular example of FIG. 1, the circuit 102 is indicated as a combinational logic circuit and the circuit 104 is indicated as a retention logic circuit. Furthermore, the circuit 106 is also indicated as a retention logic circuit and the circuit 108 is indicated as a memory circuit.

The combinational logic circuit 102 and the retention logic circuit 104 may be viewed as a first digital island, and the retention logic circuit 106 and the memory circuit 108 may be viewed as a second digital island. The circuits 102 and 108 are the power collapsible parts of their respective digital islands, so that when the system 100 is in a retention mode, the supply voltage provided to the combinational logic circuit 102 and the memory circuit 108 is essentially 0V so that these circuits do not consume power.

The circuit 102 is indicated as a combinational logic circuit and the circuit 108 is indicated as a memory circuit only as a way of providing an example. In other embodiments, these power collapsible circuits may be other kinds of circuits.

The system 100 comprises two voltage regulators, labeled 110 and 112. In the particular example of FIG. 1, these voltage regulators are linear low dropout (LDO) voltage regulators. However, embodiments are not limited to these types of voltage regulators, so that other types of voltage regulators may be used. Nevertheless, the structure of the linear low dropout voltage regulator 110 is illustrated as comprising the operational amplifier 114 and the pass transistor 116, where a first reference voltage $V_{REF1}$ is provided to an input port of the operational amplifier 114 so that a regulated voltage is provided at the output port 118. Similarly, the linear low dropout voltage regulator 112 is illustrated as comprising the operational amplifier 120 and pass transistor 122, where a second reference voltage $V_{REF2}$ is provided to an input port of the operational amplifier 120 so that a regulated voltage is provided at the output port 124.

The switch S1 when closed (ON) couples the output port 118 to the combinational logic circuit 102, and the switch S3 when closed couples the output port 124 to the memory circuit 108. The voltage provided to the combinational logic circuit 102 when the switch S1 is closed is indicated in FIG. 1 as $V_{DDX}$, the voltage at the node 126. The voltage provided to the memory circuit 108 when the switch S3 is closed is indicated as $V_{DD}$(MEM), the voltage at the node 128. When the system 100 is in the normal mode of operation, the switches S2 and S4 are ON so that the voltage $V_{DDX}$ is also provided to the retention logic circuit 104 and the voltage $V_{DD}$(MEM) is provided to the retention logic circuit 106. During the normal mode of operation, the switches S5 and S6 are OFF (open).

The feedback path 130 provides the voltage at the node 126 (which is the regulated output voltage at the output port 118 less the voltage drop across the switch S1) to an input port of the operational amplifier 114 when in the normal mode. In this way, the linear low dropout voltage regulator 110 is controlled such that there is regulation of the voltage $V_{DDX}$ provided to the combinational logic circuit 102 and the retention logic circuit 104 when the system 100 is operating in the normal mode. Similarly, the feedback path 132 provides the voltage at the node 128 less the voltage drop across the switch S4 (where the voltage at the node 128 is the regulated output voltage at the output port 124 less the voltage drop across the switch S3) to an input port of operational amplifier 120 when in the normal mode. In this way, the linear low dropout voltage regulator 112 is controlled such that there is regulation of the voltage $V_{DD}$(MEM) provided to the memory circuit 108 and the retention logic circuit 106 when the system 100 is operating in the normal mode.

The controller 134 controls operation of the switches and the linear low dropout voltage regulator 112. The comparator 136 compares the voltage $V_{DDX}$ at the node 126 to the voltage at the node 138, denoted as $V_{DD}$(EXT). The output of the comparator 136 is provided to the controller 134. For ease of illustration, the connections from the controller 134 to the various switches are not shown. The significance of the comparator 136 and the operation of the controller 134 are described in detail when discussing the modes of operation.

Figure 2:
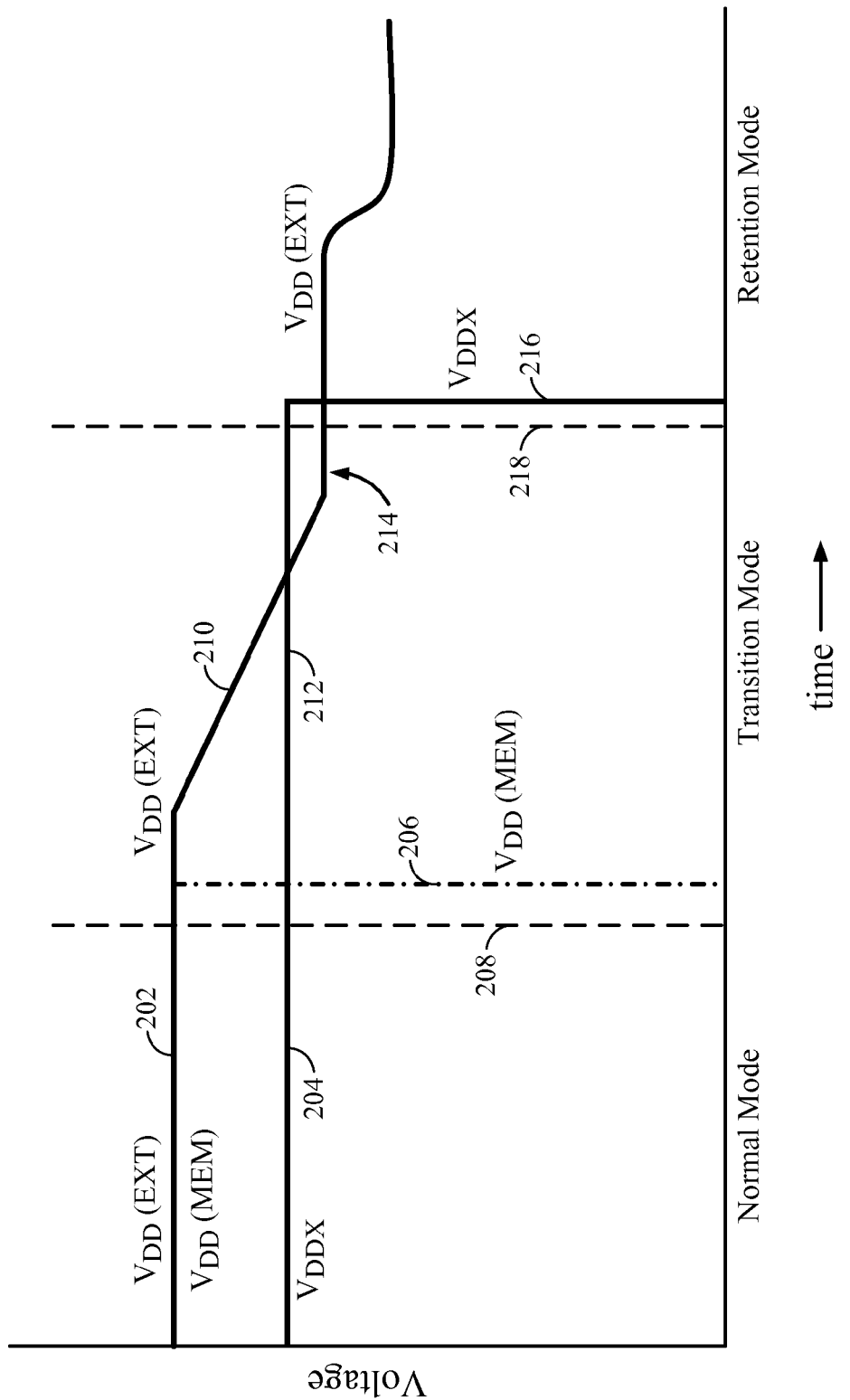
FIG. 2 illustrates voltage curves for the embodiment of FIG. 1.

When the system 100 is in the normal mode of operation, the voltage $V_{DD}$(EXT) at the node 138 is close to the voltage $V_{DD}$(MEM) at the node 128. This is illustrated in the diagram of FIG. 2, where in the normal mode of operation the voltages $V_{DD}$(EXT) and $V_{DD}$(MEM) are each represented by the line segment 202, and the voltage $V_{DDX}$ at the node 126 is represented by the line segment 204. In the particular example of FIG. 2, during the normal mode of operation the voltage $V_{DDX}$ provided to the combinational logic circuit 102 and the retention logic circuit 104 is less than the voltage $V_{DD}$(MEM) (which is close to $V_{DD}$(EXT)) provided to the memory circuit 108 and the retention logic circuit 106.

When the system 100 is put into an inactive state (or a sleep state), the combinational logic circuit 102 and the memory circuit 108 are shut down, and a retention voltage is provided to the retention logic circuits 104 and 106 so that various data and state may be maintained. Before the system 100 is put into the retention mode, embodiments provide a transition mode in which various voltages are reduced. This is illustrated in FIG. 2, where when the system 100 is put into the transition mode the voltage $V_{DD}$(MEM) is quickly brought to 0V as indicated by the dash-dot line segment 206. Ideally, the dash-dot line segment 206 may lie on top of the demarcation line 208, which denotes the beginning of the transition mode, but for ease of illustration the dahs-do line segment 206 for voltage $V_{DD}$(MEM) during the transition mode is offset from the demarcation line 208. This abrupt change in the voltage $V_{DD}$(MEM) occurs because the controller 134 opens the switch S3 as the system 100 is put into the transition mode.

When the system 100 enters the transition mode, the controller 134 opens (turns OFF) the switch S4 and closes (turns ON) the switch S5 so that the output voltage provided by the linear low dropout voltage regulator 112 is provided only to the retention logic circuit 106. As indicated by the line segment 210, the controller 134 controls the linear low dropout voltage regulator 112 such that its output voltage at the output port 124 is decreased. The voltage now applied to the retention logic circuit 106 is the voltage $V_{DD}$(EXT) at the node 138, which is the output voltage of the linear low dropout voltage regulator 122 at the output port 124 less the voltage drop across the switch S5. During the transition mode, as noted by the segment 212, the voltage $V_{DDX}$ provided to the combinational logic circuit 102 and the retention logic circuit 104 is maintained at the same value as during the normal mode of operation.

During the transition mode, the comparator 136 compares the voltage $V_{DDX}$ to the voltage $V_{DD}$(EXT). When the voltage $V_{DD}$(EXT) drops below the voltage $V_{DDX}$, the output voltage of the comparator 136 changes abruptly to indicate this event to the controller 134. This is illustrated by the rightmost portion of the transition mode indicated by the arrow 214 showing that the curve representing the voltage $V_{DD}$(EXT) is sufficiently below that of the curve representing the voltage $V_{DDX}$ such that the comparator 136 triggers the controller 134. When this event occurs, the system 100 enters the retention mode.

When the system 100 enters the retention mode, the controller 134 opens the switch S1 so that the voltage $V_{DDX}$ abruptly drops to 0V. This is indicated by the line segment 216 where again for ease of illustration is shown as offset from the demarcation line 218 denoting the beginning of the retention mode. When in the retention mode, the controller 134 continues to control the linear low dropout voltage regulator 112 such that the voltage $V_{DD}$(EXT) provided to the retention logic circuit 106 is decreased to the final retention voltage. When the system 100 is in the retention mode, the controller 134 opens the switch S2 and closes the switch S6 so that the voltage $V_{DD}$(EXT) is also provided to the retention logic circuit 104. In this way at the end of the retention mode, both of the retention logic circuits 104 and 108 operate with their supply voltages set to the final retention voltage as provided by the linear low dropout voltage regulator 112.

The various switches illustrated in FIG. 1 may be realized by transistors or pass gates, for example.

As described above, the controller 134 opens and closes the various switches illustrated in FIG. 1 to achieve the transitioning of the voltages supplied to the circuits 102, 104, 106, and 108 as illustrated and discussed with respect to FIG. 2. The operation of the switches may be encoded software, firmware, or hardware in the controller 134. For example, FIG. 3 illustrates the controller 134 in which operation of the switches is determined by three stored tables: Table 1, Table 2, and Table 3.

Table 1 provides the various states for the switches when the system 100 is operating in the normal mode. As indicated in Table 1, the switches S1, S2, S3, and S4 are each ON, and the switches S5 and S6 are each OFF. In Table 2 when the system 100 is in the transition mode, the switches S1, S2, and S5 are each ON, and the switches S3, S4, and S6 are each OFF. In Table 3 when the system 100 is in the retention mode, the switches S5 and S6 are each ON, and the switches S1, S2, S3, and S4 are each OFF.

Figure 4:
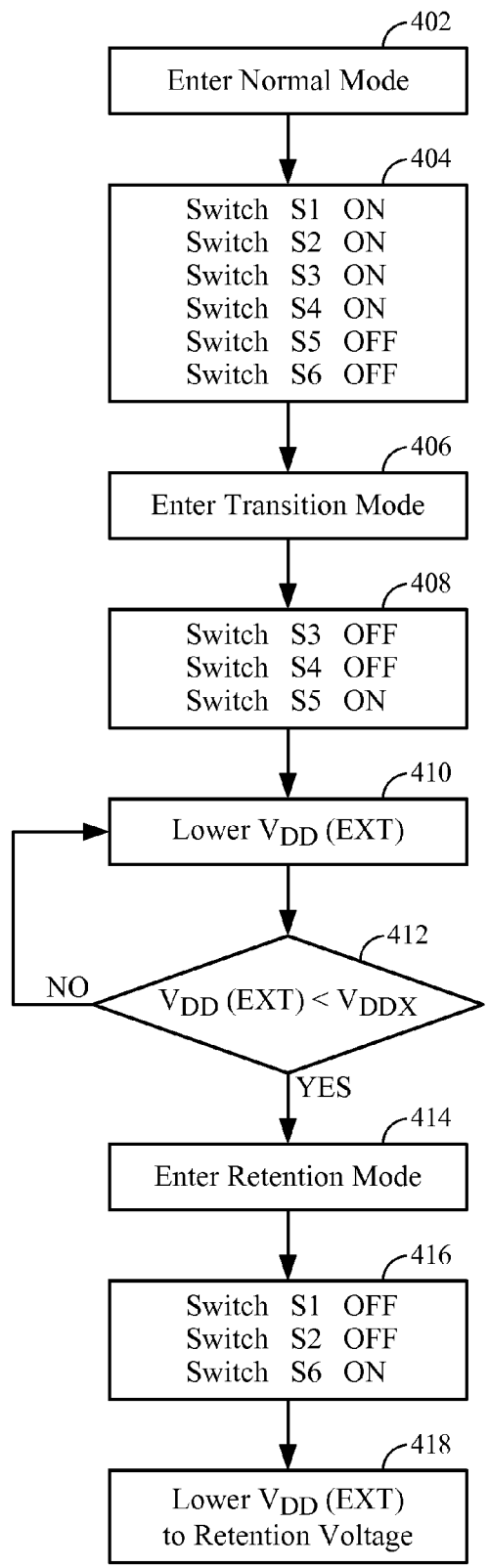
FIG. 4 is a flow diagram illustrating operation of the embodiment of FIG. 1.

FIG. 4 is a flow diagram illustrating operating modes (or states) and actions performed by the controller 134 as discussed above. Assume the system 100 has entered the normal mode of operation after having been in the retention mode, as indicated by the action 402. As indicated in the action 404, the controller 134 switches ON the switches S1, S2, S3, and S4, and switches OFF the switches S5 and S6. These actions put the switches into the state indicated by Table 1 of FIG. 3.

Now suppose that the system 100 is to be put into the retention mode. Before the system 100 enters the retention mode, it enters the transition mode as indicated by the action 406. As illustrated in the action 408, the controller 134 switches OFF the switches S3 and S4, and switches ON the switch S5. These actions put the switches into the state according to Table 2 of FIG. 3.

While the system 100 is in the transition mode, the controller 134 lowers the output voltage of the linear low dropout voltage regulator 112. This is indicated by the action 410. The comparator 136 as discussed previously provides a signal to the controller 134 indicative of when the voltage $V_{DD}$(EXT) falls below the voltage $V_{DDX}$. The controller 134 continues to lower the voltage $V_{DD}$(EXT) until it falls below the voltage $V_{DDX}$. This is indicated by the action 412 and the loop from the "NO" determination of the action 412 to the action 410.

When the voltage $V_{DD}$(EXT) falls below the voltage $V_{DDX}$, the system 100 enters the retention mode as indicated by the action 414. As illustrated in the action 416, the controller 134 switches OFF the switches S1 and S2, and switches ON the switch S6. These actions put the switches into the state indicated by Table 3 in FIG. 3. As indicated in the action 418, the controller 134 continues to lower the output voltage of the linear low dropout voltage regulator 112 until the voltage $V_{DD}$(EXT) provided to the retention logic circuits 104 and 106 reaches the desired final retention voltage.

Figure 5:
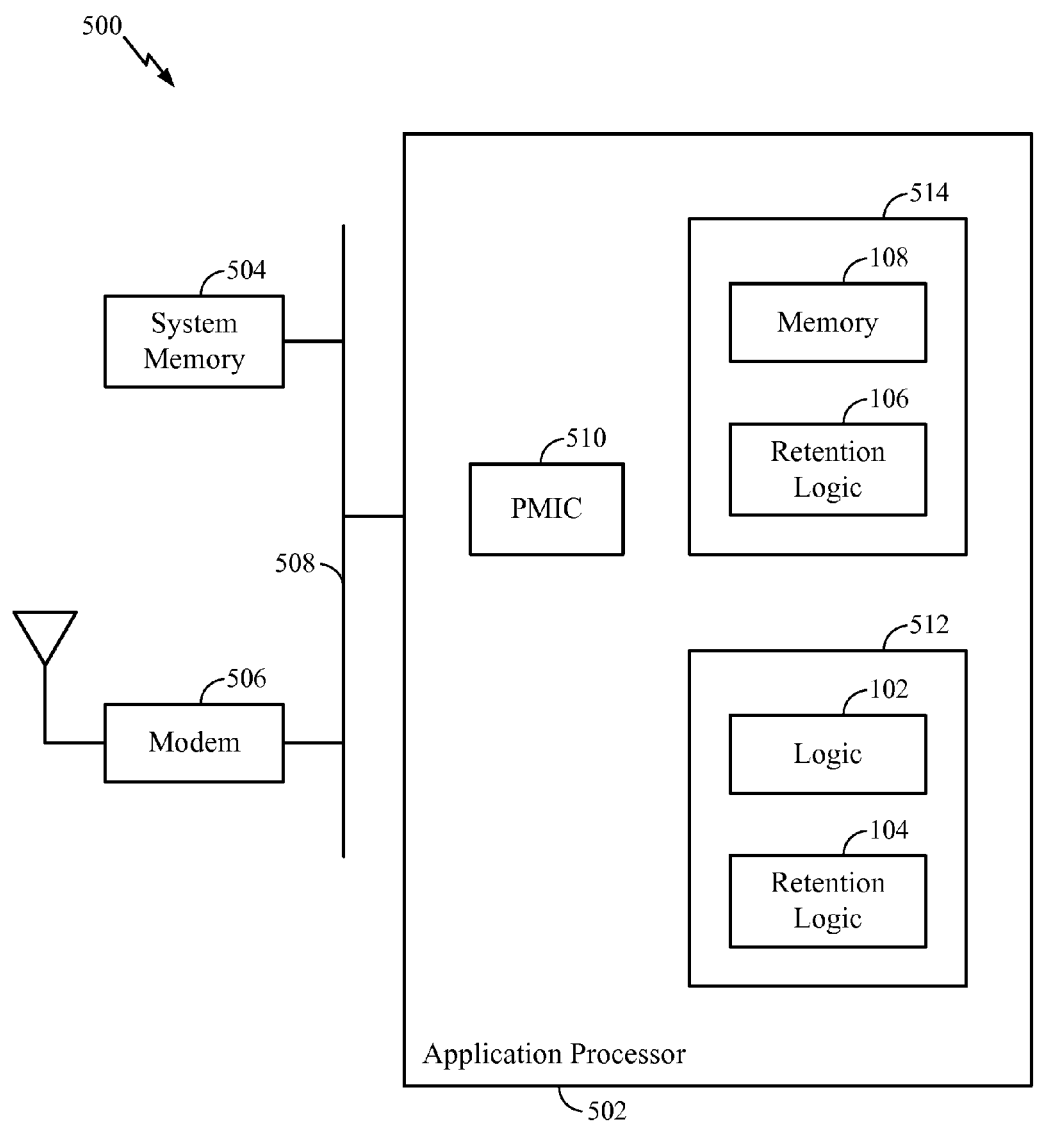
FIG. 5 illustrates an electronic system in which embodiments may find application.

FIG. 5 illustrates an electronic system 500 in which embodiments may find applications. The system 500 may include one or more integrated circuits, where one or more of these integrated circuits may be a system-on-chip (SOC). In the particular example of FIG. 5, the electronic system 500 is a wireless communication device, such as a smart phone, comprising an application processor 502, a system memory 504, and a modem 506, where the bus 508 interconnects these functional units. The controller 134 as described with respect to FIG. 1 is included in the power management integrated circuit (PMIC) 510 embedded in the application processor 502. Also illustrated in the application processor 502 are two digital islands 512 and 514, where the digital island 512 includes the combinational logic circuit 102 and the retention logic circuit 104, and the digital island 514 includes the retention logic circuit 106 and the memory circuit 108.

The PMIC 510 may also include one or more voltage regulators, such as for example the linear low dropout voltage regulators 110 and 112. In other embodiments, some or all of the voltage regulators within the application processor 502 may reside on subsystems outside the PMIC 510. The PMIC 510 may be controlled by software that is loaded from memory, such as for example the system memory 504, or the PMIC 510 may be controlled by firmware. In some embodiments, one or more of the functions performed by the PMIC 510 may be hardwired into the PMIC 510. In some cases, the PMIC 510 may be prompted to put one or more functional units in the application processor 502 (for example the digital islands 512 and 514) into a transition mode in response to software running on the application processor 502 that has been downloaded from the system memory 504. The PMIC 510 may also be prompted by various input signals provided by the user of the electronic system 500 to put one or more functional units into the transition mode and eventually the retention mode.

Figure 6:
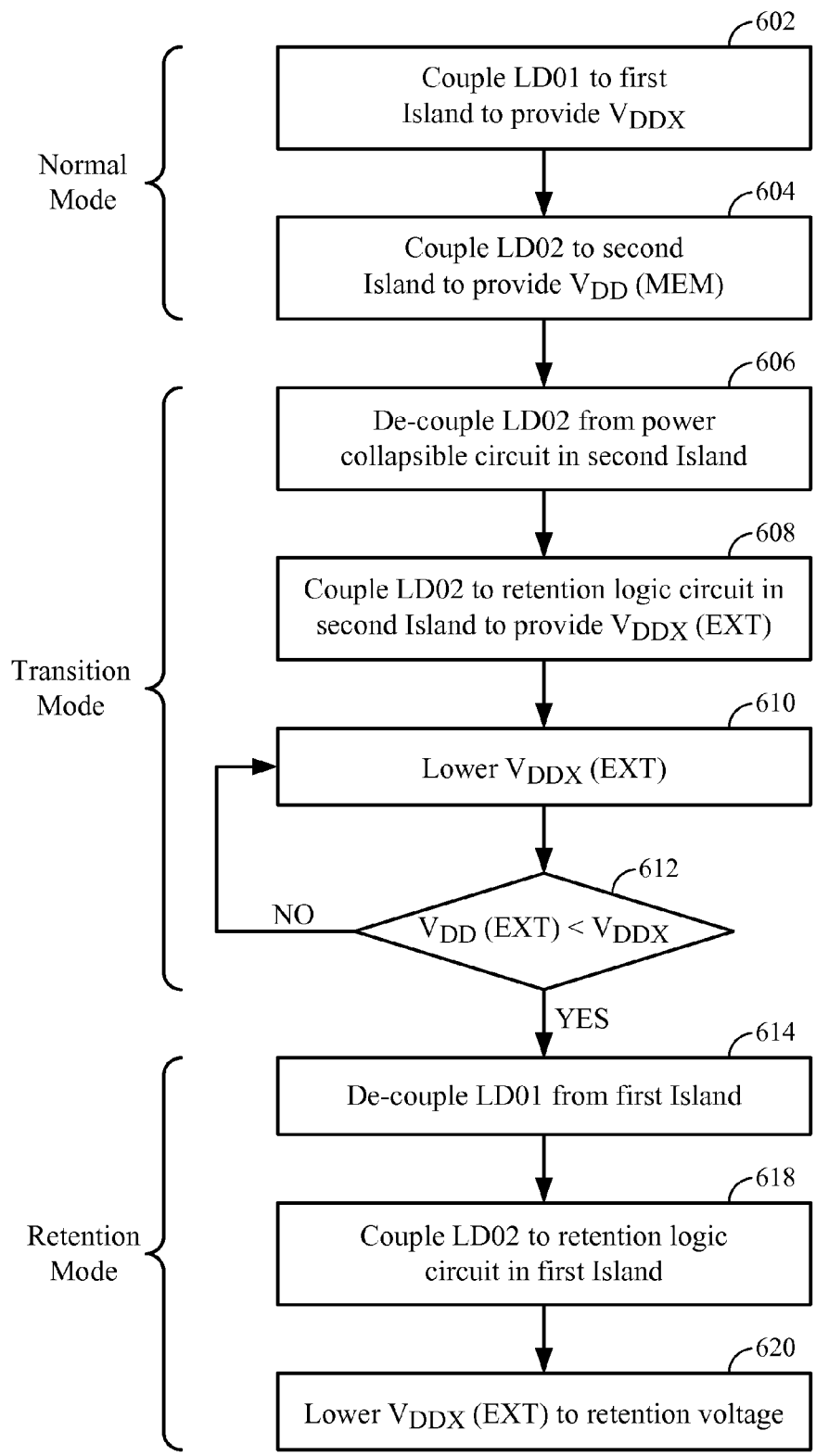
FIG. 6 is a flow diagram illustrating operation of the embodiment of FIG. 1.

FIG. 6 abstracts the opening and closing of the various switches in FIG. 4 into actions involving coupling and decoupling the two linear low dropout voltage regulators 110 and 112. Referring to FIG. 6, in the action 602 the first linear low dropout voltage regulator (e.g., the linear low dropout voltage regulator 110) is coupled to the first digital island (e.g., the combinational logic circuit 102 and the retention logic circuit 104) to provide the voltage $V_{DDX}$. In the action 604, the second linear low dropout voltage regulator (e.g., the linear low dropout voltage regulator 112) is coupled to the second digital island (e.g., the retention logic circuit 106 and the memory circuit 108) to provide the voltage $V_{DD}$(MEM).

Referring to FIG. 1, the actions 602 and 604 in FIG. 6 may be realized by switching ON the switches S1 and S2, and switching ON the switches S3 and S4. FIG. 6 illustrates that the actions 602 and 604 may be grouped together into the normal mode of operation.

Referring to FIG. 1, during the normal mode when the switches S1 and S2 are closed, note that the voltage provided to the retention logic circuit 104 is not exactly equal to $V_{DDX}$ because of the voltage drop across the switch S2. Nevertheless, because the combinational logic circuit 102 and the retention logic circuit 104 together with the switch S2 may be viewed as comprising a first digital island, the voltage $V_{DDX}$ may be viewed as being applied to the first digital island. In any event, the voltage provided to the retention logic circuit 104 is close to the voltage $V_{DDX}$. Similarly, the voltage provided to the retention logic circuit 106 is not exactly equal to the voltage $V_{DD}$(MEM) due to the voltage drop across the switch S4, but nevertheless the voltage $V_{DD}$(MEM) may be viewed as being applied to a second digital island comprising a collapsible power part (the memory circuit 108), a retention part (the retention logic circuit 106), and the switch S4.

Referring again to FIG. 6, in the action 606 the second linear low dropout voltage regulator is decoupled from the power collapsible circuit in the second digital island (e.g., the memory 108), and in the action 608 the second linear low dropout voltage regulator is coupled to the retention logic circuit in the second digital island to provide the voltage $V_{DD}$(EXT). Referring to FIG. 1, this is accomplished by switching OFF the switches S3 and S4, and switching ON the switch S5. As indicated in the action 610, the voltage $V_{DD}$(EXT) is lowered, and in action 612 it is compared to the voltage $V_{DDX}$ as with the loop from the NO outcome of the action 612 back to the action 610. As indicated in FIG. 6, the actions 606, 608, 610, and 612 belong to the transition mode.

When the voltage $V_{DD}$(EXT) falls below the voltage $V_{DDX}$, then as indicated in the YES determination in the action 612, the action 614 occurs whereby the first linear low dropout voltage regulator is decoupled from the first digital island, and as indicated in the action 618 the second linear low dropout voltage regulator is coupled to the retention logic circuit in the first digital island. Referring to FIG. 1, the actions 614 and 618 may be realized by opening the switch S1 and closing the switch S6. As indicated in the action 620, the voltage $V_{DD}$(EXT) is lowered until it reaches the retention voltage. The actions 614, 618, and 620 are grouped together and are included in the retention mode.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for an area and power efficient switchable supply network for powering multiple digital islands. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method comprising:
   coupling an output port of a first voltage regulator to a first power collapsible circuit and a first retention circuit to provide a first supply voltage;
   coupling an output port of a second voltage regulator to a second power collapsible circuit and a second retention circuit to provide a second supply voltage greater than the first supply voltage;
   de-coupling the output port of the second voltage regulator from the second power collapsible circuit;
   coupling the output port of the second voltage regulator to the second retention circuit to provide a supply voltage;
   lowering the supply voltage; and
   comparing the first supply voltage to the supply voltage as the supply voltage is lowered.

2. The method of claim 1, further comprising:
   in response to the comparing indicating that the supply voltage is below the first supply voltage, de-coupling the output port of the first voltage regulator from the first power collapsible circuit and the first retention circuit, and coupling the output port of the second voltage regulator to the first retention circuit to provide the supply voltage to the first retention circuit.

3. The method of claim 2, further comprising:
lowering the supply voltage to a retention voltage.

4. The method of claim 1, wherein
the coupling the output port of the first voltage regulator comprises switching ON a first switch and switching ON a second switch to couple the output port of the first voltage regulator to the first power collapsible circuit and the first retention circuit;
the coupling the output port of the second voltage regulator comprises switching ON a third switch and switching ON a fourth switch to couple the output port of the second voltage regulator to the second power collapsible circuit and the second retention circuit;
the de-coupling the output port of the second voltage regulator from the second power collapsible circuit comprises switching OFF the third and fourth switches; and
the coupling the output port of the second voltage regulator to the second retention circuit comprises switching ON a fifth switch.

5. The method of claim 4, wherein
in response to the comparing indicating that the supply voltage is below the first supply voltage, de-coupling the output port of the first voltage regulator from the first power collapsible circuit and the first retention circuit by switching OFF the first and second switches, and coupling the output port of the second voltage regulator to the first retention circuit to provide the supply voltage to the first retention circuit by switching ON a sixth switch.

6. The method of claim 5, further comprising:
lowering the supply voltage to a retention voltage.

7. The method of claim 5, wherein
the first and second switches are serially connected to each other;
the third and fourth switches are serially connected to each other; and
the fifth and sixth switches are serially connected to each other.

8. A circuit comprising:
a first voltage regulator to provide a first supply voltage;
a second voltage regulator to provide a second supply voltage and a supply voltage, the second supply voltage greater than the first supply voltage;
a first power collapsible circuit;
a first retention circuit;
a second power collapsible circuit;
a second retention circuit;
a comparator; and
a controller coupled to the first voltage regulator, the second voltage regulator, and the comparator, the controller to:
during a normal mode, couple the first voltage regulator to the first power collapsible circuit and the first retention circuit to provide the first supply voltage, and couple the second voltage regulator to the second power collapsible circuit and the second retention circuit to provide the second supply voltage; and
during a transition mode, de-couple the second voltage regulator from the second power collapsible circuit, couple the second voltage regulator to the second retention circuit to provide the supply voltage and to lower the supply voltage, and configure the comparator to compare the first supply voltage to the supply voltage as the supply voltage is lowered.

9. The circuit of claim 8, wherein the controller, in response to the supply voltage falling below the first supply voltage, enters a retention mode to de-couple the first voltage regulator from the first power collapsible circuit and the first retention circuit, and couple the second voltage regulator to the first retention circuit to provide the supply voltage to the first retention circuit.

10. The circuit of claim 9, wherein during the retention mode, the controller lowers the supply voltage to a retention voltage.

11. The circuit of claim 8, further comprising:
a first switch to couple the first voltage regulator to the first power collapsible circuit;
a second switch to couple the first voltage regulator to the first retention circuit;
a third switch to couple the second voltage regulator to the second power collapsible circuit;
a fourth switch to couple the second voltage regulator to the second retention circuit; and
a fifth switch to couple the second voltage regulator to the second retention circuit;
wherein the controller, during the normal mode, switches ON the first switch and the switches ON the second switch to couple the first voltage regulator to the first power collapsible circuit and the first retention circuit, and switches ON the third switch and switches ON the fourth switch to couple the second voltage regulator to the second power collapsible circuit and the second retention circuit; and
wherein the controller, during the transition mode, switches OFF the third switch and switches OFF the fourth switch to de-couple the second voltage regulator from the second power collapsible circuit, and switches ON the fifth switch to couple the second voltage regulator to the second retention circuit.

12. The circuit of claim 11, further comprising:
a sixth switch to couple the second voltage regulator to the first retention circuit;
wherein the controller, in response to the comparator indicating that the supply voltage is below the first supply voltage during the transition mode, enters the retention mode and switches OFF the first switch and switches OFF the second switch to de-couple the first voltage regulator from the first power collapsible circuit and the first retention circuit, and switches ON the sixth switch to couple the second voltage regulator to the first retention circuit to provide the supply voltage to the first retention circuit.

13. The circuit of claim 12, wherein the controller, during the retention mode, lowers the supply voltage to a retention voltage.

14. The circuit of claim 12, wherein
the first and second switches are serially connected to each other;
the third and fourth switches are serially connected to each other; and
the fifth and sixth switches are serially connected to each other.

15. A circuit comprising:
a first voltage regulator having an output port;
a first power collapsible circuit;
a first retention circuit;
a second voltage regulator having an output port;
a second power collapsible circuit;

a second retention circuit;
means for coupling the output port of the first voltage regulator to the first power collapsible circuit and the first retention circuit to provide a first supply voltage;
means for coupling the output port of the second voltage regulator to the second power collapsible circuit and the second retention circuit to provide a second supply voltage greater than the first supply voltage;
means for de-coupling the output port of the second voltage regulator from the second power collapsible circuit;
means for coupling the output port of the second voltage regulator to the second retention circuit to provide a supply voltage;
means for lowering the supply voltage; and
means for comparing the first supply voltage to the supply voltage as the supply voltage is lowered.

16. The circuit of claim 15, further comprising:
means for de-coupling the output port of the first voltage regulator from the first power collapsible circuit and the first retention circuit in response to the means for comparing indicating that the supply voltage is below the first supply voltage; and
means for coupling the output port of the second voltage regulator to the first retention circuit to provide the supply voltage to the first retention circuit in response to the means for comparing indicating that the supply voltage is below the first supply voltage.

17. The circuit of claim 16, wherein the means for lowering the supply voltage lowers the supply voltage to a retention voltage in response to the means for comparing indicating that the supply voltage is below the first supply voltage.

18. The circuit of claim 15, further comprising:
a first switch;
a second switch;
a third switch;
a fourth switch; and
a fifth switch;
wherein the means for coupling the output port of the first voltage regulator to the first power collapsible circuit and the first retention circuit to provide a first supply voltage comprises switching ON the first switch and switching ON the second switch to couple the output port of the first voltage regulator to the first power collapsible circuit and the first retention circuit;
wherein the means for coupling the output port of the second voltage regulator to the second power collapsible circuit and the second retention circuit comprises switching ON the third switch and switching ON the fourth switch to couple the output port of the second voltage regulator to the second power collapsible circuit and the second retention circuit;
wherein the means for de-coupling the output port of the second voltage regulator from the second power collapsible circuit comprises switching OFF the third switch and switching OFF the fourth switch; and
wherein the means for coupling the output port of the second voltage regulator to the second retention circuit comprises switching ON the fifth switch.

19. The circuit of claim 18, further comprising:
means for de-coupling the output port of the first voltage regulator from the first power collapsible circuit and the first retention circuit by switching OFF the first and second switches in response to the comparator indicating that the supply voltage is below the first supply voltage; and
means for coupling the output port of the second voltage regulator to the first retention circuit to provide the supply voltage to the first retention circuit by switching ON a sixth switch in response to the comparator indicating that the supply voltage is below the first supply voltage.

20. The circuit of claim 19, wherein the means for lowering the supply voltage lowers the supply voltage to a retention voltage in response to the means for comparing indicating that the supply voltage is below the first supply voltage.

* * * * *